(12) United States Patent
Ma et al.

(10) Patent No.: US 9,739,958 B2
(45) Date of Patent: Aug. 22, 2017

(54) WAFER LEVEL PACKAGED OPTICAL SUBASSEMBLY AND TRANSCEIVER MODULE HAVING SAME

(71) Applicant: SAE Magnetics (H.K.) Ltd., Hong Kong (HK)

(72) Inventors: Wei Ma, Hong Kong (HK); Wai Hung, Hong Kong (HK); Francis Guillen Gamboa, Hong Kong (HK); Xiaoming Yu, Hong Kong (HK); Dennis Tak Kit Tong, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 0 days.

(21) Appl. No.: 15/201,519

(22) Filed: Jul. 4, 2016

(65) Prior Publication Data

US 2016/0313514 A1 Oct. 27, 2016

Related U.S. Application Data

(63) Continuation of application No. 14/535,310, filed on Nov. 6, 2014, now Pat. No. 9,429,727.

(51) Int. Cl.

| | | |
|---|---|---|
| *G02B 6/12* | (2006.01) | |
| *G02B 6/42* | (2006.01) | |
| *H01S 5/183* | (2006.01) | |
| *G02B 6/32* | (2006.01) | |
| *H01S 5/026* | (2006.01) | |

(52) U.S. Cl.
CPC ............... *G02B 6/423* (2013.01); *G02B 6/32* (2013.01); *G02B 6/4214* (2013.01); *G02B 6/4232* (2013.01); *G02B 6/4246* (2013.01); *G02B 6/4292* (2013.01); *H01S 5/0261* (2013.01); *H01S 5/0267* (2013.01); *H01S 5/18302* (2013.01); *G02B 6/425* (2013.01)

(58) Field of Classification Search
None
See application file for complete search history.

(56) References Cited

U.S. PATENT DOCUMENTS

| | | | | |
|---|---|---|---|---|
| 9,052,476 B2 * | 6/2015 | Tong | ..................... | G02B 6/4204 |
| 2004/0101020 A1* | 5/2004 | Bhandarkar | ......... | G02B 6/4292 |
| | | | | 372/109 |
| 2005/0062056 A1* | 3/2005 | Baugh | .................. | G02B 6/4214 |
| | | | | 257/98 |
| 2005/0063642 A1* | 3/2005 | Gallup | ................. | G02B 6/4214 |
| | | | | 385/33 |
| 2005/0254758 A1* | 11/2005 | Kropp | .................. | G02B 6/4201 |
| | | | | 385/89 |
| 2011/0057273 A1* | 3/2011 | O'Donnell | ............ | B81C 1/0023 |
| | | | | 257/414 |

(Continued)

*Primary Examiner* — Sung Pak

(57) ABSTRACT

An optical subassembly includes: a TSV submount layer carrying an active optical component and a sandwich cap bonded to the TSV submount layer. The sandwich cap includes a bottom spacer layer disposed above the TSV submount layer, a glass layer above the bottom spacer layer, and an upper spacer layer above the glass layer. A cavity is defined in the bottom spacer layer and configured for accommodating the active optical component. At least one first lens is formed on the glass layer and is opposite to the active optical component. An alignment feature is formed in the upper spacer layer.

20 Claims, 26 Drawing Sheets

(56) References Cited

U.S. PATENT DOCUMENTS

| | | | |
|---|---|---|---|
| 2012/0183256 A1* | 7/2012 | Shao .................... | G02B 6/4292 385/39 |
| 2013/0182996 A1* | 7/2013 | Shastri ................... | G02B 6/42 385/14 |
| 2013/0308910 A1* | 11/2013 | Nishimura ............. | G02B 6/381 385/78 |
| 2014/0064659 A1* | 3/2014 | Doerr .................... | G02B 6/428 385/14 |

* cited by examiner

WAFER LEVEL PACKAGED OPTICAL SUBASSEMBLY AND TRANSCEIVER MODULE HAVING SAME

CROSS-REFERENCE TO RELATED APPLICATIONS

The present application is a Continuation Application of U.S. application Ser. No. 14/535,310 filed on Nov. 6, 2014, the contents of which are hereby incorporated by reference.

FIELD OF THE PATENT APPLICATION

The present patent application generally relates to optoelectronics technologies and more specifically to a wafer-level packaged optical subassembly, a method for fabricating the optical subassembly, and a transceiver module having the optical subassembly.

BACKGROUND

Significant growth in VCSEL-based short-reach optical links is anticipated for data centers and consumer devices markets. An innovative photonic package design for optical transceivers is needed to address the anticipated growth, and to facilitate market's adoption of optical transceivers.

There are two major approaches to package optoelectronic components for an optical transceiver module. One makes use of a metal-can package with a transparent window to hermetically seal active optoelectronic elements, suffering from the drawbacks of high cost on package submount, non-efficiency on individual piece production, low accuracy manual alignment, and etc.; another directly bonds active optical components and driver ICs onto a printed circuit board (PCB), suffering from the drawbacks of individual piece handling on polymer lens assembly and burning in testing. A high precision package structure is desired for optical components and driver ICs. It is further desired to have a manufacturing process of the package structure that supports batch production, ensures high accuracy alignment, provides hermetic package, and has high throughput.

SUMMARY

The present patent application is directed to an optical subassembly. In one aspect, the optical subassembly includes: a TSV submount layer carrying an active optical component and a sandwich cap bonded to the TSV submount layer. The sandwich cap includes a bottom spacer layer disposed above the TSV submount layer, a glass layer above the bottom spacer layer, and an upper spacer layer above the glass layer. A cavity is defined in the bottom spacer layer and configured for accommodating the active optical component. At least one first lens is formed on the glass layer and is opposite to the active optical component. An alignment feature is formed in the upper spacer layer.

The alignment feature may be a through silicon opening and opposite to the cavity of the bottom spacer layer. The at least one first lens may be formed on one side of the glass layer that is facing the cavity of the bottom spacer layer. The optical subassembly may further include a plurality of solder balls formed on a side of the TSV submount layer in a wafer level process.

The optical subassembly may further include a first metal layer disposed above the TSV submount layer and a second metal layer disposed below the TSV submount layer. The first metal layer and the second metal layer may respectively include metal pads and routing traces, and may be made of Al, Cu, or Au, while the first metal layer may include an alignment mark configured for precisely placing the active optical component.

The TSV submount layer may include a structure with a first hole with metal deposited surrounding and a second hole filled by metal to achieve a hermetic package by sealing a silicon through via in the TSV submount layer. The first lens may be formed on the glass layer by wafer lever processing, and configured for collecting maximum light and making the light collimated.

The optical subassembly may further include a metal sealing ring disposed on the TSV submount layer and configured for hermetic sealing and connecting the bottom spacer layer to a ground, and a metallized fiducial mark for optical alignment. The metal sealing ring and the metallized fiducial mark may be formed in a same metal deposition process, while the metal sealing ring may be made of Au or eutectic solder, and has a thickness less than 10 μm.

The TSV submount layer may be made of silicon and have a thickness ranging from 50 μm to 300 μm, the glass layer may have a thickness ranging from 50 μm to 300 μm, the upper spacer layer may be made of silicon and have a thickness of about 500 μm, while the bottom spacer layer may be made of silicon and have a thickness less than 1000 μm.

Side walls of the cavity may be slant or straight. The optical subassembly may further include an IC driver. The IC driver may be accommodated in the cavity. The optical subassembly may further include an IC driver. The IC driver may be integrated at the bottom of the optical subassembly by a flip chip.

In another aspect, the present patent application provides an optical transceiver module that includes: an optical subassembly, the optical subassembly including a TSV submount layer carrying an active optical component and a sandwich cap with an optical window and an alignment feature bonded to the TSV submount layer; a jumper detachably mounted to the optical subassembly with the alignment feature; and an optical fiber detachably mounted to the jumper. The sandwich cap includes a bottom spacer layer disposed above the TSV submount layer, a glass layer above the bottom spacer layer, and an upper spacer layer above the glass layer. A cavity is defined in the bottom spacer layer and configured for accommodating the active optical component. At least one first lens is formed at a side of the glass layer that is facing the cavity. At least one second lens is formed on a bottom surface of the jumper towards the first lens.

The optical transceiver module may further include at least one third lens formed on a 45 degree surface of the jumper, and being configured for changing light path and further focusing the light coming from the optical subassembly. The sandwich cap may be formed by wafer level anodic bonding and bonded to the TSV submount layer by thermo compression.

In yet another aspect, the present patent application provides a method for fabricating an optical subassembly. The method includes: preparing a TSV submount layer; die bonding and wire bonding for mounting an active optical component to the TSV submount layer; forming a sandwich cap with an optical window and an alignment feature; and bonding the sandwich cap to the TSV submount layer. The sandwich cap includes a bottom spacer layer disposed above the TSV submount layer, a glass layer above the bottom spacer layer, and an upper spacer layer above the glass layer.

A cavity is defined in the bottom spacer layer and configured for accommodating the active optical component. A first lens or lens array is formed at a side of the glass layer that is facing the cavity.

The alignment feature may be formed in the upper spacer layer and configured for detachably mounting a jumper that connects to an optical fiber. The TSV submount layer may be made of silicon and have a thickness ranging from 50 µm to 300 µm. The glass layer may have a thickness ranging from 50 µm to 300 µm. The upper spacer layer may be made of silicon and have a thickness of about 500 µm. The bottom spacer layer may be made of silicon and have a thickness less than 1000 µm. The method may further include forming a plurality of solder balls on a side of the TSV submount layer in a wafer level process.

BRIEF DESCRIPTIONS OF THE DRAWINGS

DETAILED DESCRIPTION

Reference will now be made in detail to a preferred embodiment of the wafer level packaged optical subassembly and the transceiver module having the same disclosed in the present patent application, examples of which are also provided in the following description. Exemplary embodiments of the optical subassembly and the transceiver module disclosed in the present patent application are described in detail, although it will be apparent to those skilled in the relevant art that some features that are not particularly important to an understanding of the optical subassembly and the transceiver module may not be shown for the sake of clarity.

Furthermore, it should be understood that the optical subassembly and the transceiver module disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
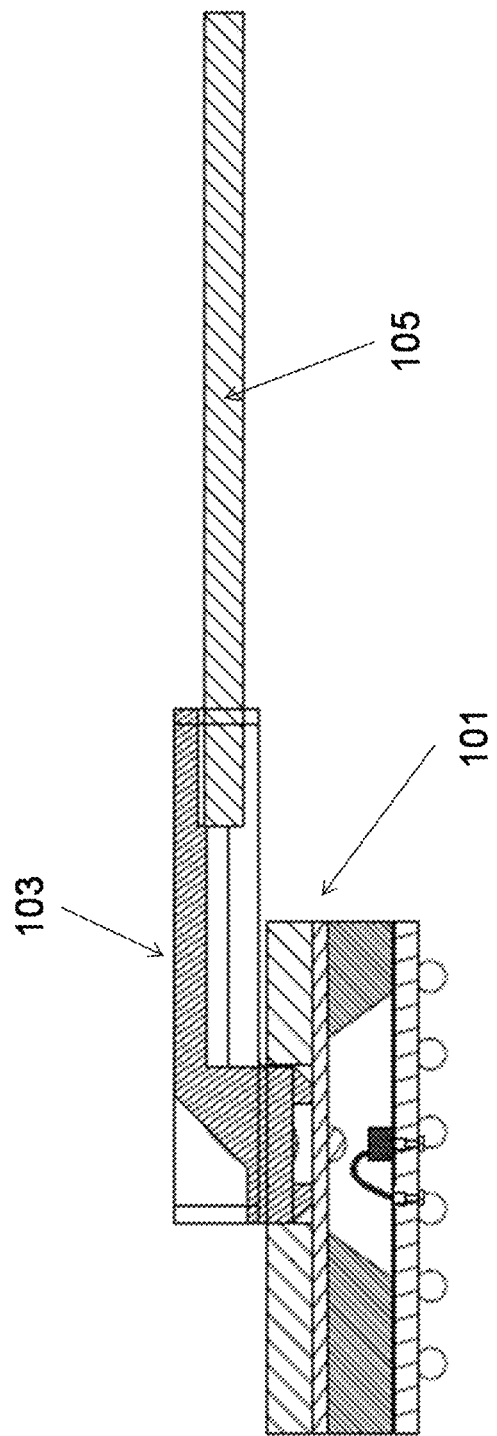
FIG. 1 is a cross-sectional view of an optical transceiver module in accordance with an embodiment of the present patent application.
Figure 2:
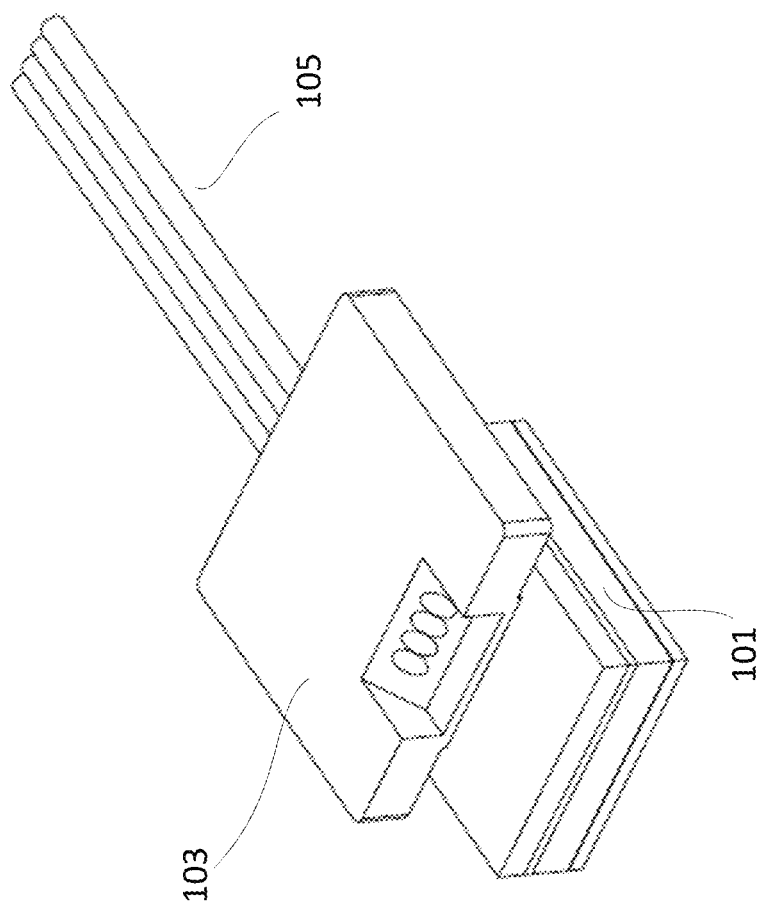
FIG. 2 is a perspective view of the optical transceiver module depicted in FIG. 1.

FIG. 1 is a cross-sectional view of an optical transceiver module in accordance with an embodiment of the present patent application. FIG. 2 is a perspective view of the optical transceiver module depicted in FIG. 1. Referring to FIG. 1 and FIG. 2, the optical transceiver module includes an optical subassembly (i.e. optical engine) 101, a jumper 103 detachably mounted to the optical subassembly 101, and an optical fiber 105 detachably mounted to the jumper 103.

Figure 3:
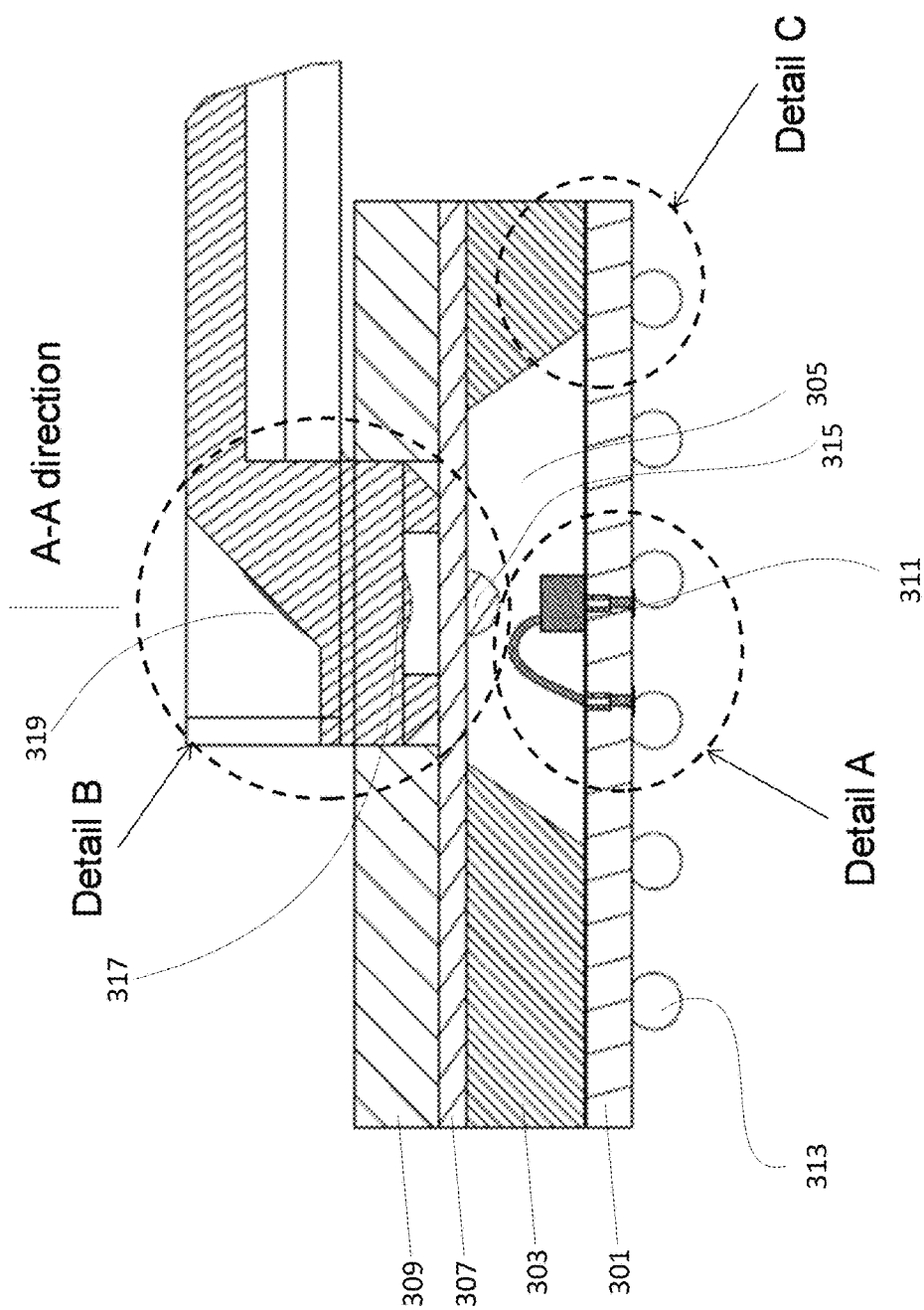
FIG. 3 is a partial closed-up view of the optical transceiver module depicted in FIG. 1.
Figure 4:
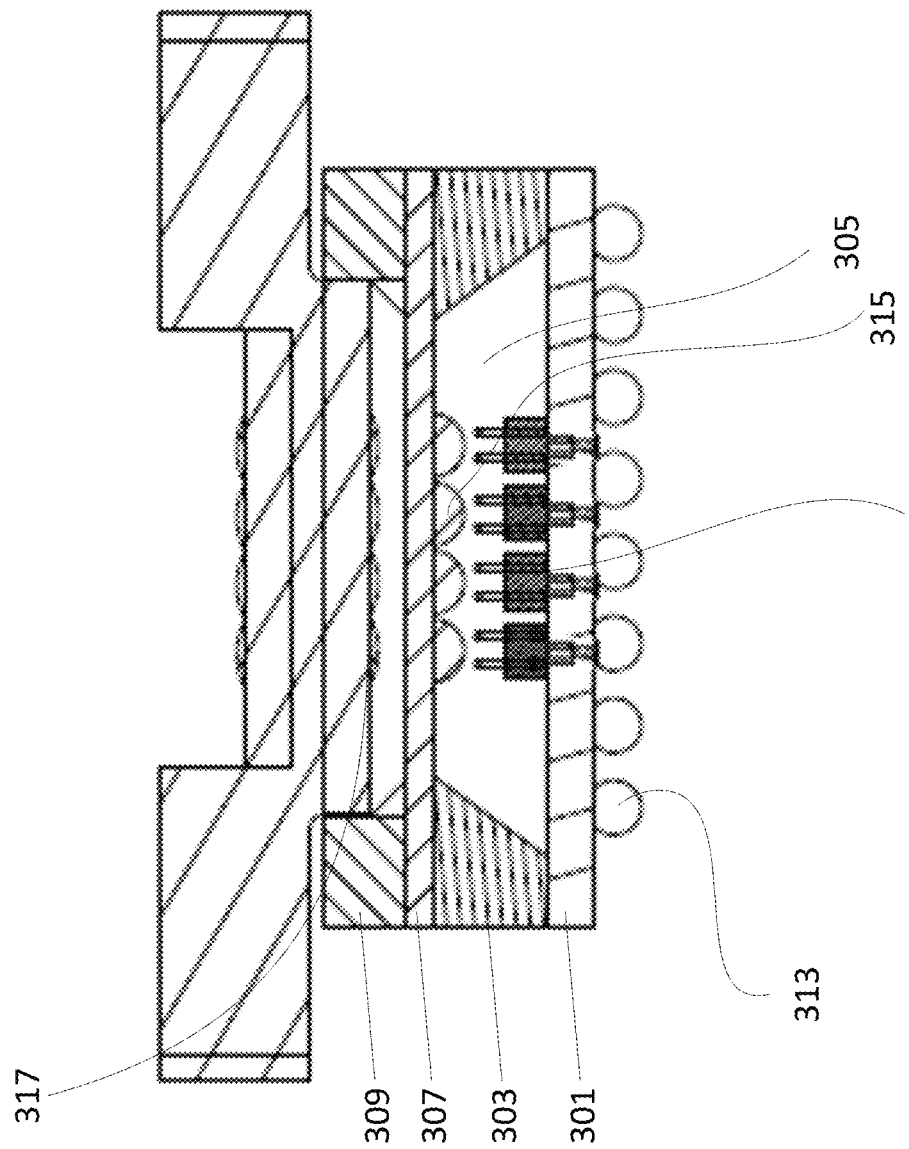
FIG. 4 is a cross-sectional view of the optical transceiver module taken along line A-A depicted in FIG. 3.

FIG. 3 is a partial closed-up view of the optical transceiver module depicted in FIG. 1. FIG. 4 is a cross-sectional view of the optical transceiver module taken along line A-A depicted in FIG. 3. Referring to FIGS. 3 and 4, the optical subassembly 101 includes a TSV (Through Silicon Via) submount layer 301, a bottom spacer layer 303 above the TSV submount layer 301, a glass layer 307 above the bottom spacer layer 303, and an upper spacer layer 309 above the glass layer 307. A cavity 305 is defined in the bottom spacer layer 303. A first lens 315 is formed at a side of the glass layer 307 that is facing the cavity 305. Active optical components 311, in either a singlet form or an array form, are mounted to a side of the TSV submount layer 301 facing the cavity 305 and accommodated thereby. A number of solder balls 313 are formed on the other side of the TSV submount layer 301 in a wafer level process for module SMT assembly on PCB. An open window/alignment feature 901 (shown in FIG. 9) is defined in the upper spacer layer 309 for receiving external opto-mechanical parts, such as the jumper 103. The jumper 103 includes a second lens 317 and a third lens 319 configured for directing light coming from the optical subassembly 101, the jumper 103 is mounted to the optical subassembly 101 and coupled to the alignment feature 901. Referring to FIG. 3, more description will be made to portions Detail A, Detail B and Detail C of the optical transceiver module.

Figure 5:
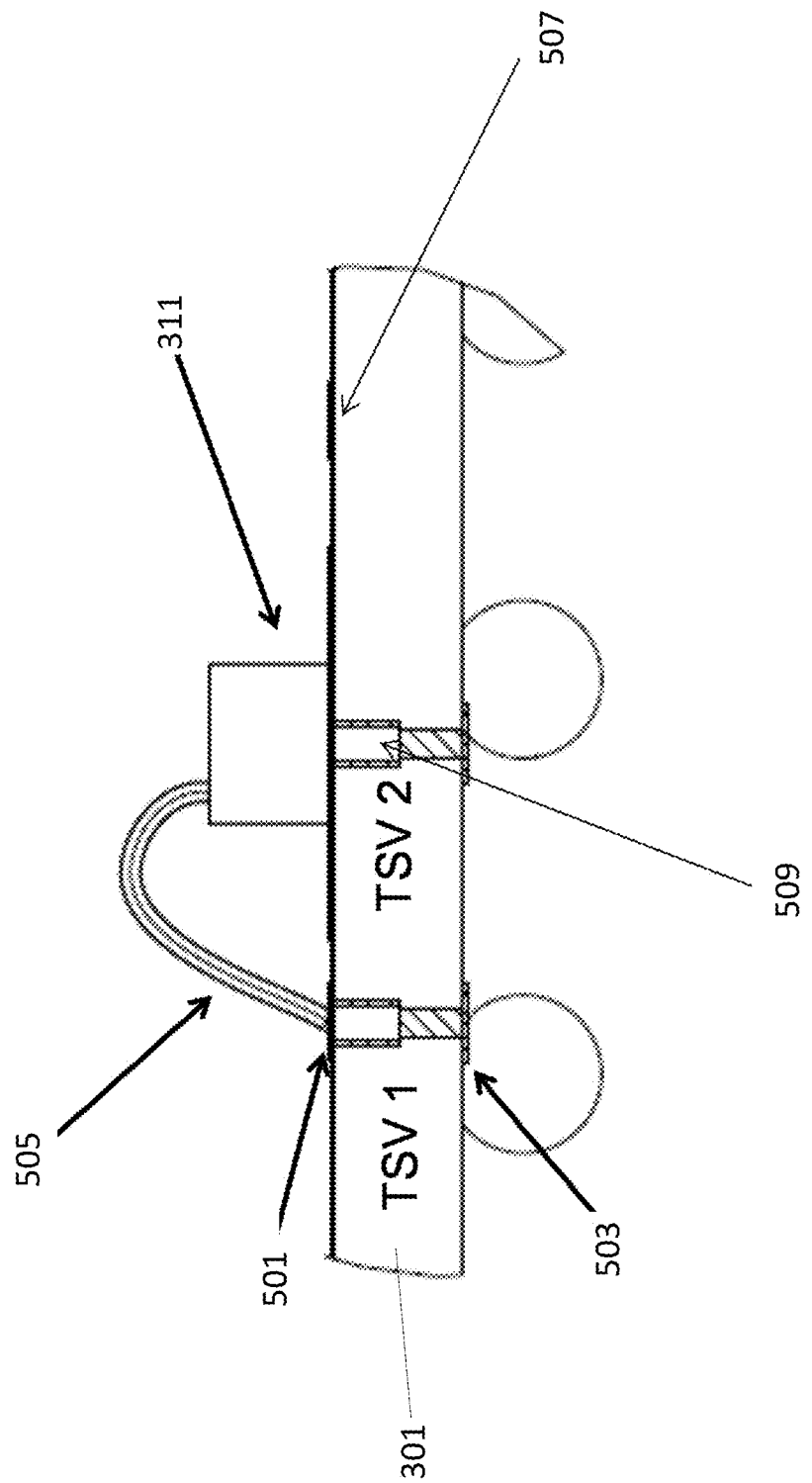
FIG. 5 is a magnified view of the portion Detail A of the optical transceiver module depicted in FIG. 3.

FIG. 5 is a magnified view of the portion Detail A of the optical transceiver module depicted in FIG. 3. Referring to FIG. 5, a first metal layer 501 is disposed above the submount layer 301. The first metal layer 501 may include submount front side metal pads and routing traces, and may be made of Al, Cu, Au or etc. A second metal layer 503 is disposed below the submount layer 301. The second metal layer 503 may include submount back side metal pad and routing trace, and may be made of Al, Cu, Au or etc. FIG. 5 illustrates a through silicon via (TSV) submount layer with big hole and small hole structures 509. The big hole is a through hole with metal deposited surrounding. The small hole is filled by metal to keep the package hermeticity. In FIG. 5, TSV 1 is configured for electrical connection, while TSV 2 is configured for thermal dissipation. A wire 505 is connecting the active optical components and the first metal layer 501. In this embodiment, the first metal layer 501 includes an alignment mark 507 configured for precisely placing the active optical components.

Figure 6:
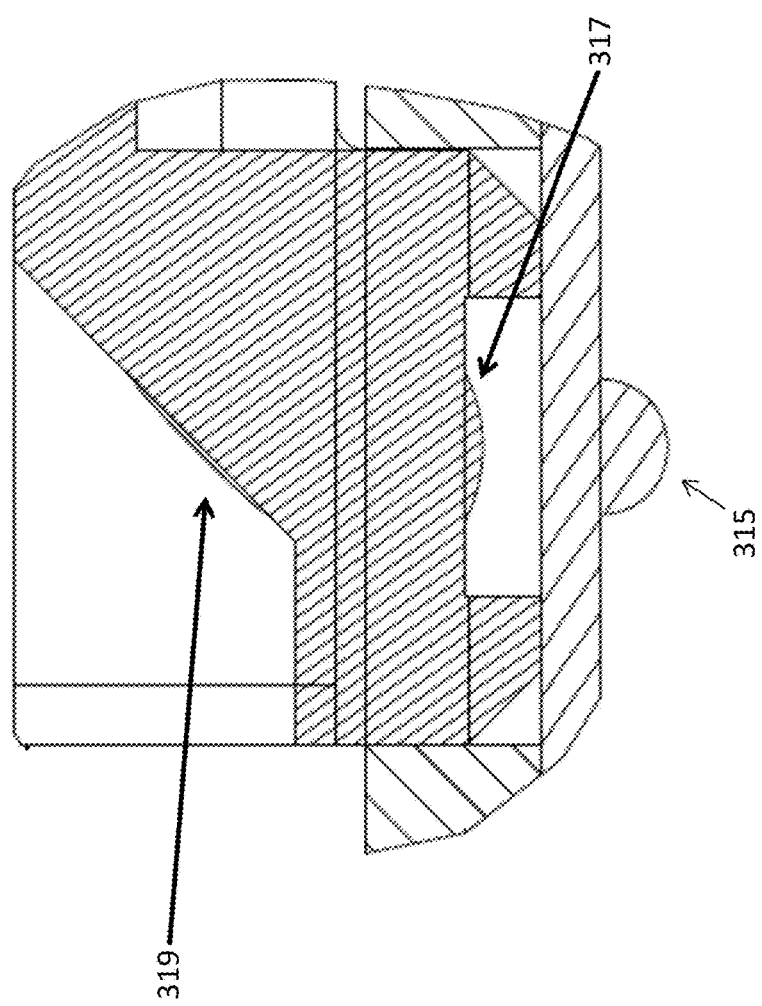
FIG. 6 is a magnified view of the portion Detail B of the optical transceiver module depicted in FIG. 3.
Figure 7:
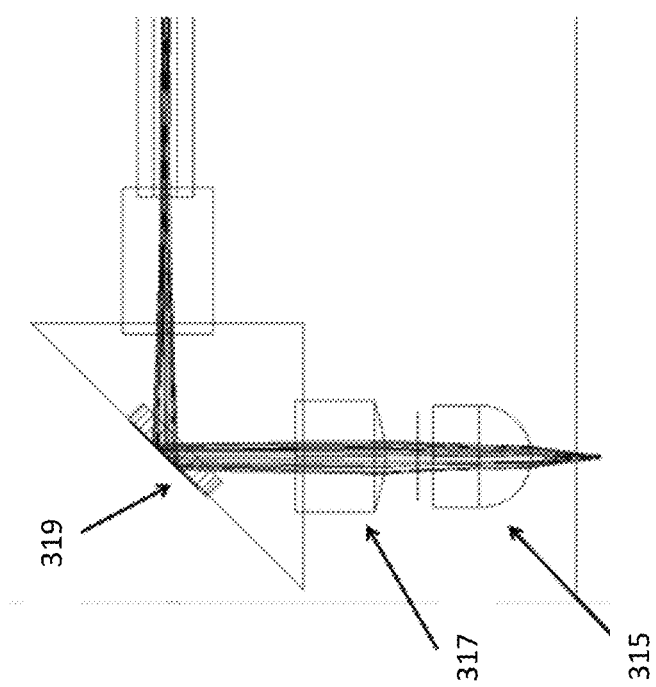
FIG. 7 shows a simulation result of a triple lens system as depicted in FIG. 6.

FIG. 6 is a magnified view of the portion Detail B of the optical transceiver module depicted in FIG. 3. Referring to FIG. 6, the first lens 315 is formed on glass wafer, made by wafer lever processing and configured for collecting maximum light and making the light more collimated. The second lens 317 is formed on the jumper 103 toward the first lens 315, and configured for collecting the light and correcting aberration. The third lens 319 is formed on a 45 degree surface of the jumper 103, and configured for changing light path and further focusing the light. FIG. 7 shows a simulation result of a triple lens system as depicted in FIG. 6. Referring to FIG. 7, for a 10% power drop, the tolerance requirement can be loosed from several microns to more than ten microns, which makes the assembly process easy to perform. As shown in FIG. 7, the triple lens system includes the first lens 315, the second lens 317, and the third lens 319.

Figure 8:
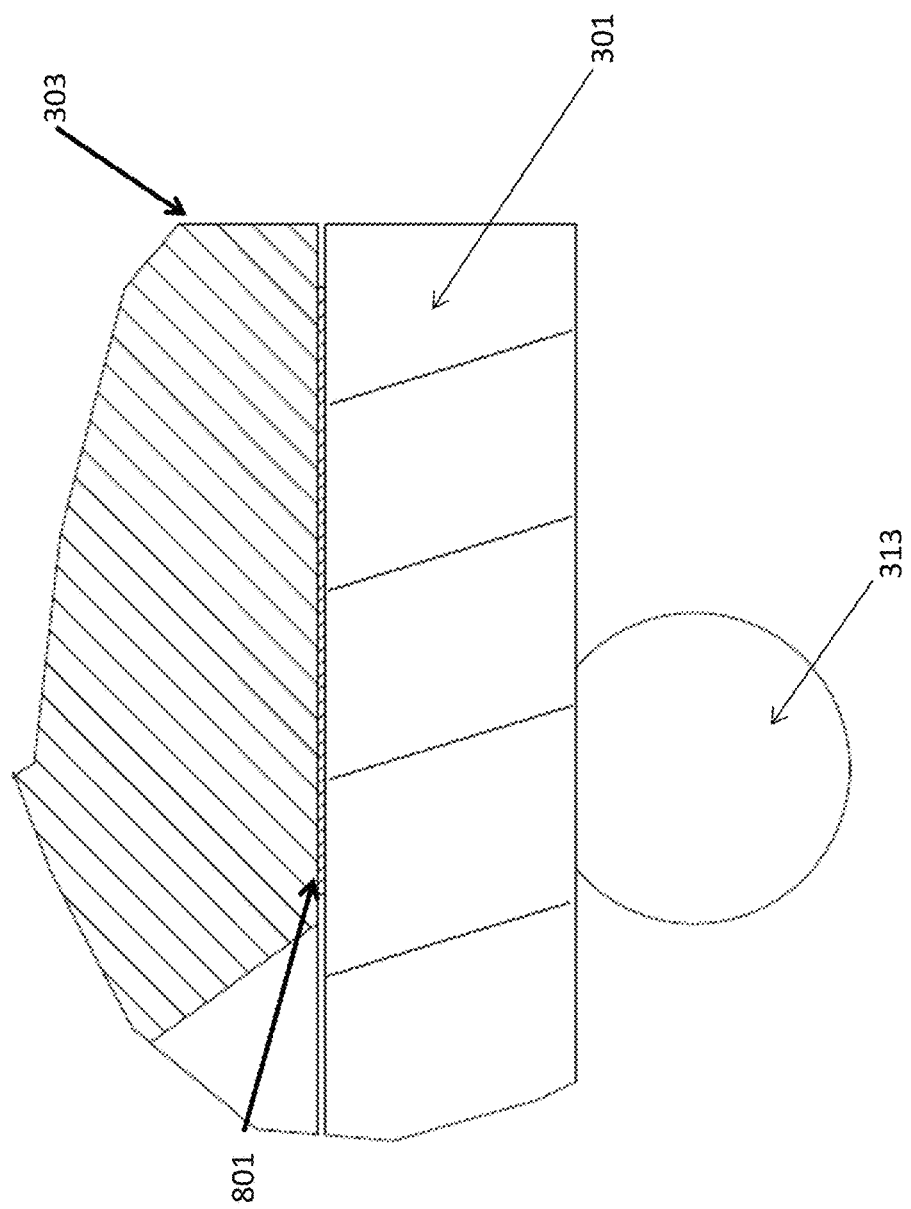
FIG. 8 is a magnified view of the portion Detail C of the optical transceiver module depicted in FIG. 3.

FIG. 8 is a magnified view of the portion Detail C of the optical transceiver module depicted in FIG. 3. Referring to FIG. 8, a metal sealing ring 801 is disposed on the TSV submount silicon (layer) 301 and configured for hermetic sealing and connecting the bottom spacer layer to the ground so as to make it as an EMI shield. The metal sealing ring 801 is made of Au, eutectic solder, or etc., and has a thickness ranging from 1 µm to 10 µm. The TSV submount silicon (layer) 301 has a thickness ranging from 50 µm to 300 µm. The bottom spacer layer 303 is made of silicon and has a thickness less than 1000 µm.

Figure 9:
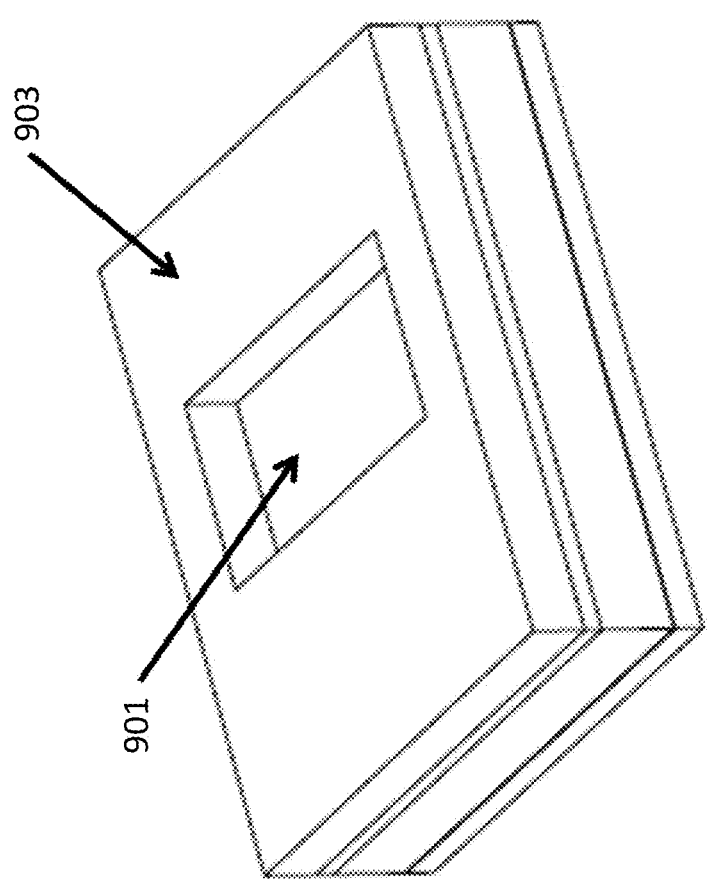
FIG. 9 is a front side perspective view of an optical subassembly in accordance with an embodiment of the present patent application.
Figure 10:
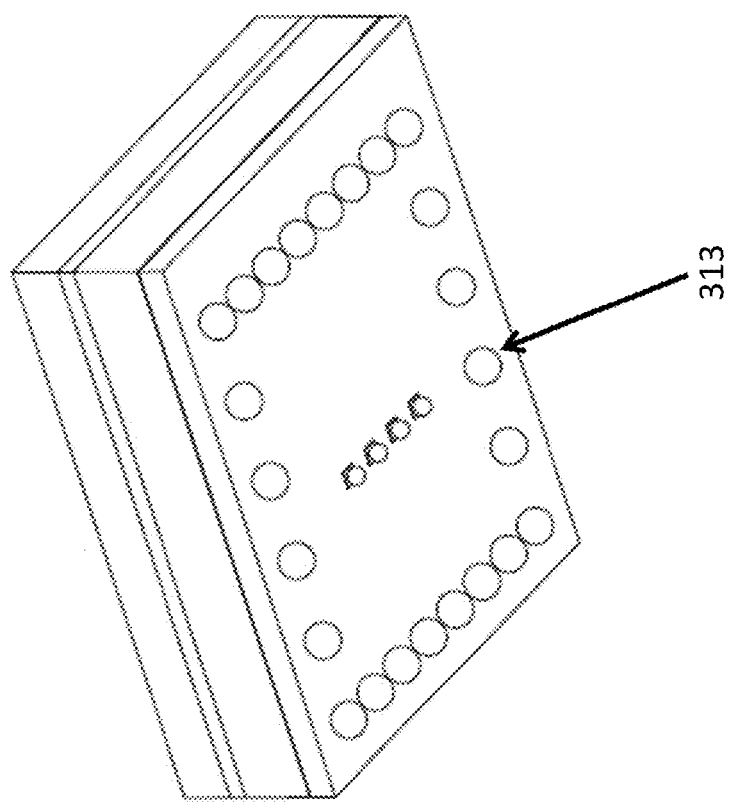
FIG. 10 is a back side perspective view of the optical subassembly depicted in FIG. 9.

FIG. 9 is a front side perspective view of an optical subassembly in accordance with an embodiment of the present patent application. Referring to FIG. 9, an optical window and alignment feature 901 for receiving external opto-mechanical parts is defined and formed on a front side 903 of the upper spacer layer, with the shapes of rectangular, circle or others. The exact opening size, position and the side wall will guide the external opto-mechanical part, such as the jumper 103 to insert into it and align precisely corresponding to the optical components in the optical engine. FIG. 10 is a back side perspective view of the optical subassembly depicted in FIG. 9. Referring to FIG. 10, a plurality of solder balls 313 are disposed on the back side of the optical subassembly and configured for further SMT assembly. The dimension of the optical subassembly is about (2~4) mm×(2~4) mm×1 mm There are normally 2000~3000 pieces of the optical subassembly on an 8 inch wafer.

Figure 11:
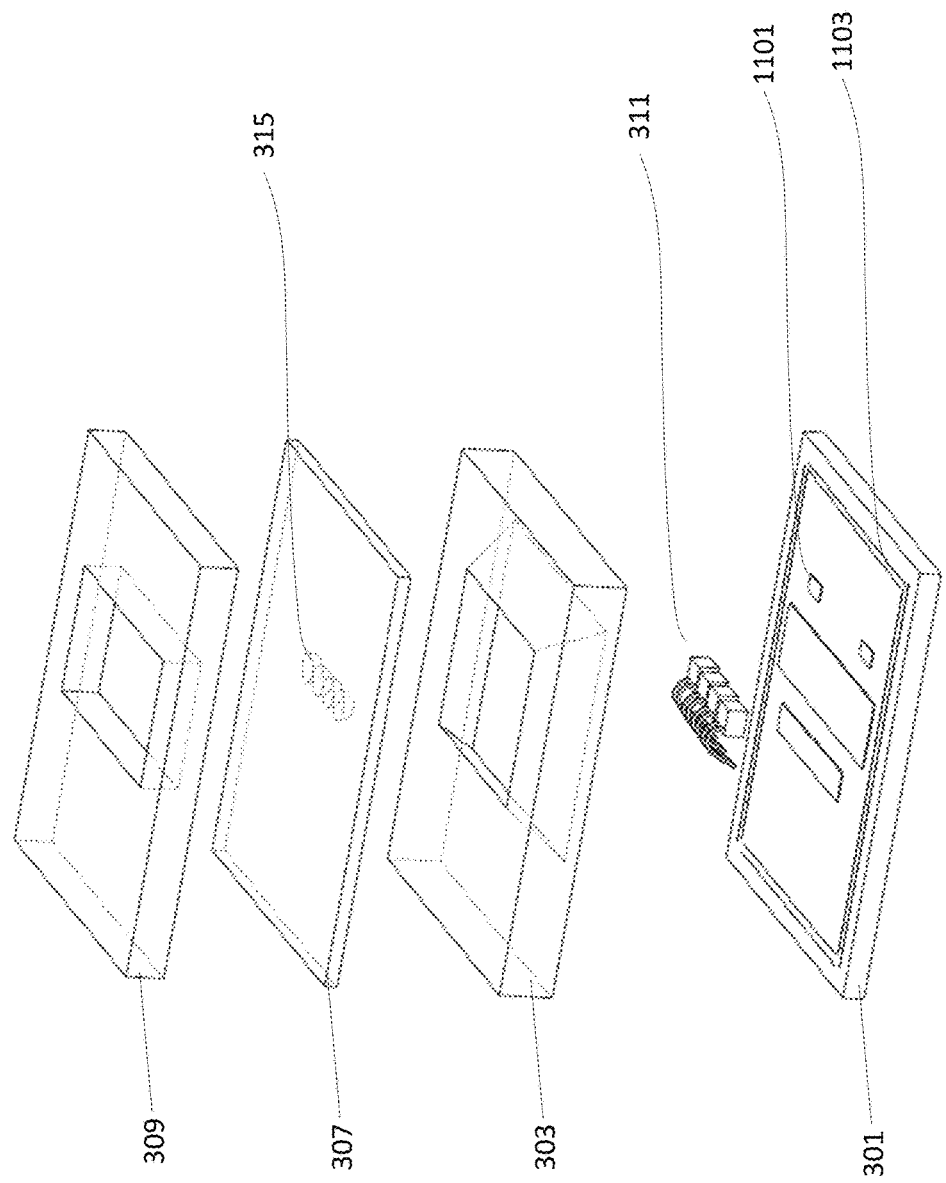
FIG. 11 is an exploded view of the optical subassembly depicted in FIG. 9.

FIG. 11 is an exploded view of the optical subassembly depicted in FIG. 9. Referring to FIG. 11, the TSV submount layer 301 is made of silicon, 50~300 µm thick, and with metal pads and traces, metallized fiducial marks 1101 for ensuring alignment, metallized sealing ring 1103, formed in a same metal deposition process. TSVs are formed to connect package to external circuits or systems. Active optical components 311 are wire bonded to connect to the electrical routings, and connect to the outside of the package by TSV. The bottom spacer layer 303 is made of silicon, about 500 µm in thickness, with a rectangular opening as a window of optical path. Slant side walls are formed by silicon fabrication process. In an alternative embodiment, straight side walls or side walls of other shapes are formed instead. The glass layer 307 with lens (array) has a thickness of about 50~300 µm, and configured to provide a cap for hermetic sealing, a transparent window for the optical path, and lens (such as the first lens 315) formed by wafer level process with accurate alignment with the active optical components 311. The upper spacer layer 309 is made of silicon, about 500 µm in thickness, and with rectangular opening as the window of optical path and the alignment feature. It is understood that the opening may take other shapes in other embodiments of the present patent application.

Figure 12:
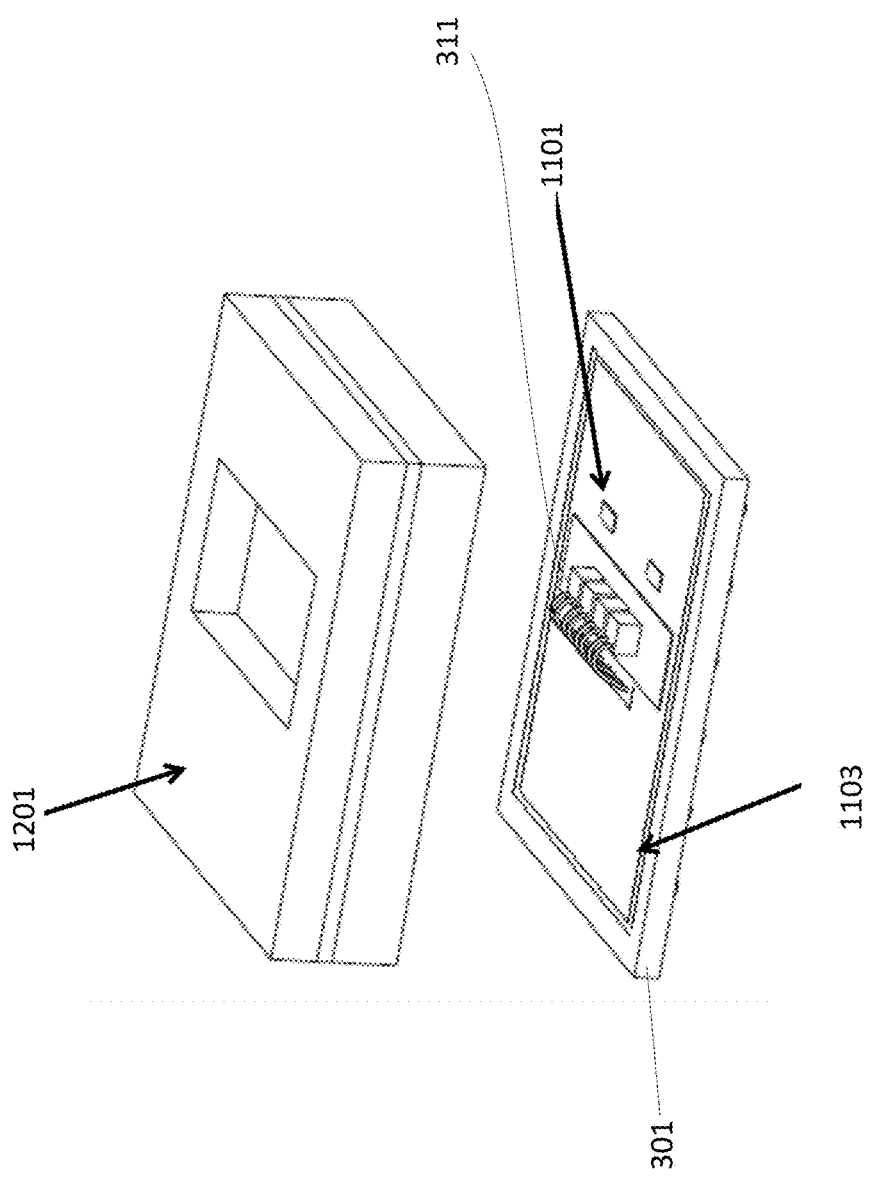
FIG. 12 is another exploded view of the optical subassembly depicted in FIG. 9.

FIG. 12 is another exploded view of the optical subassembly depicted in FIG. 9. FIG. 12 illustrates the assembly process of the optical subassembly. Referring to FIG. 12, the assembly process includes: preparing the TSV submount layer 301; wafer level die bonding and wire bonding for active optical components; forming a sandwich cap 1201; and bonding the sandwich cap 1201 to the TSV submount layer 301. It is noted that all of the above steps are wafer level fabrication.

Figure 13:
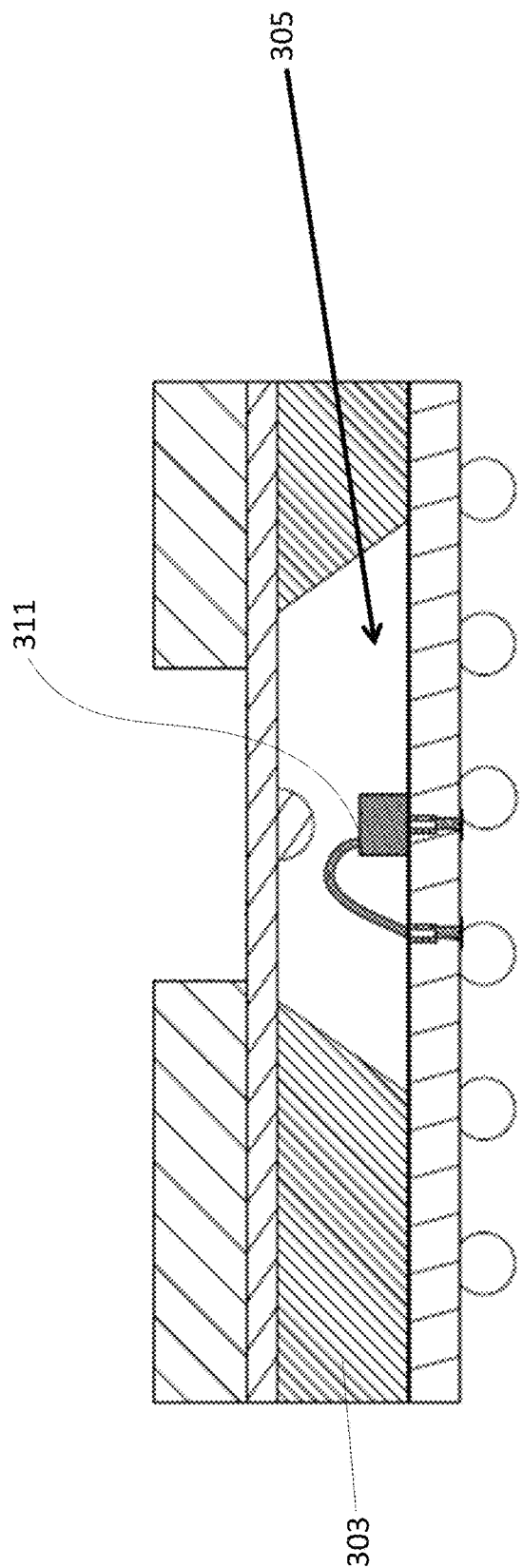
FIG. 13 is a cross-sectional view of the optical subassembly depicted in FIG. 9.

FIG. 13 is a cross-sectional view of the optical subassembly depicted in FIG. 9. Referring to FIG. 13, the cavity 305 is formed in the bottom spacer layer 303 to accommodate the active optical components 311. The side walls of the cavity 305 are slant.

Figure 14:
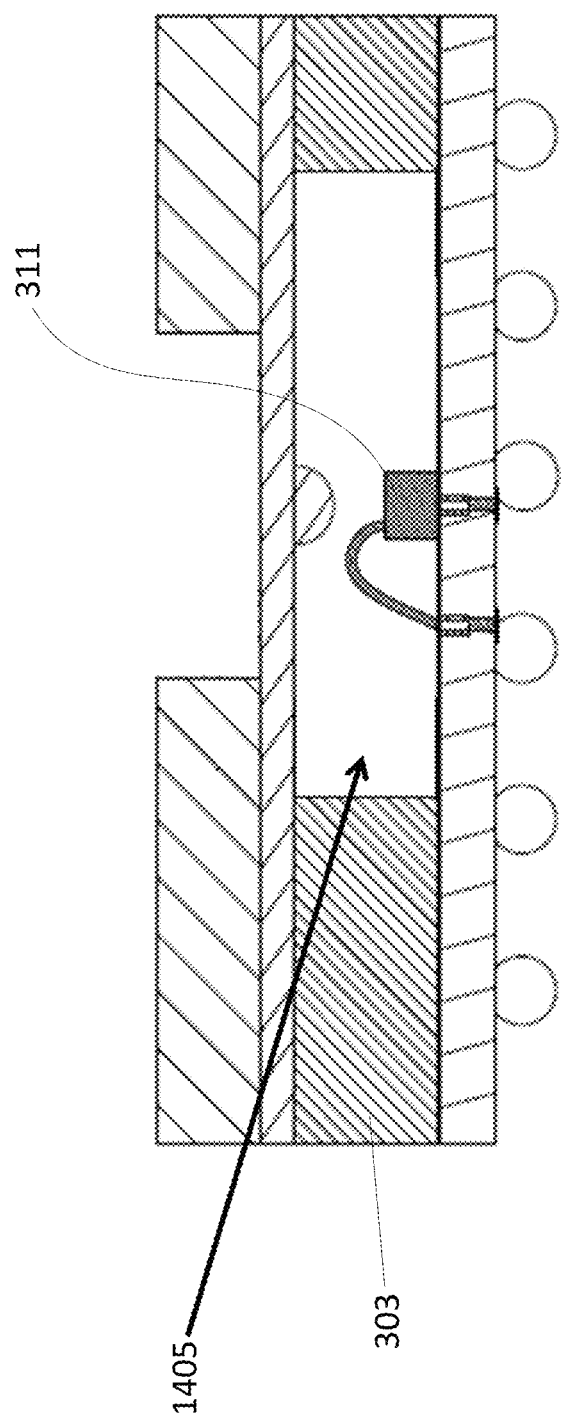
FIG. 14 is a cross-sectional view of an optical subassembly according to another embodiment of the present patent application.

FIG. 14 is a cross-sectional view of an optical subassembly according to another embodiment of the present patent application. Referring to FIG. 14, the cavity 1405 is formed in the bottom spacer layer 303 to accommodate the active optical components 311. The side walls of the cavity 1405 are straight.

Figure 15:
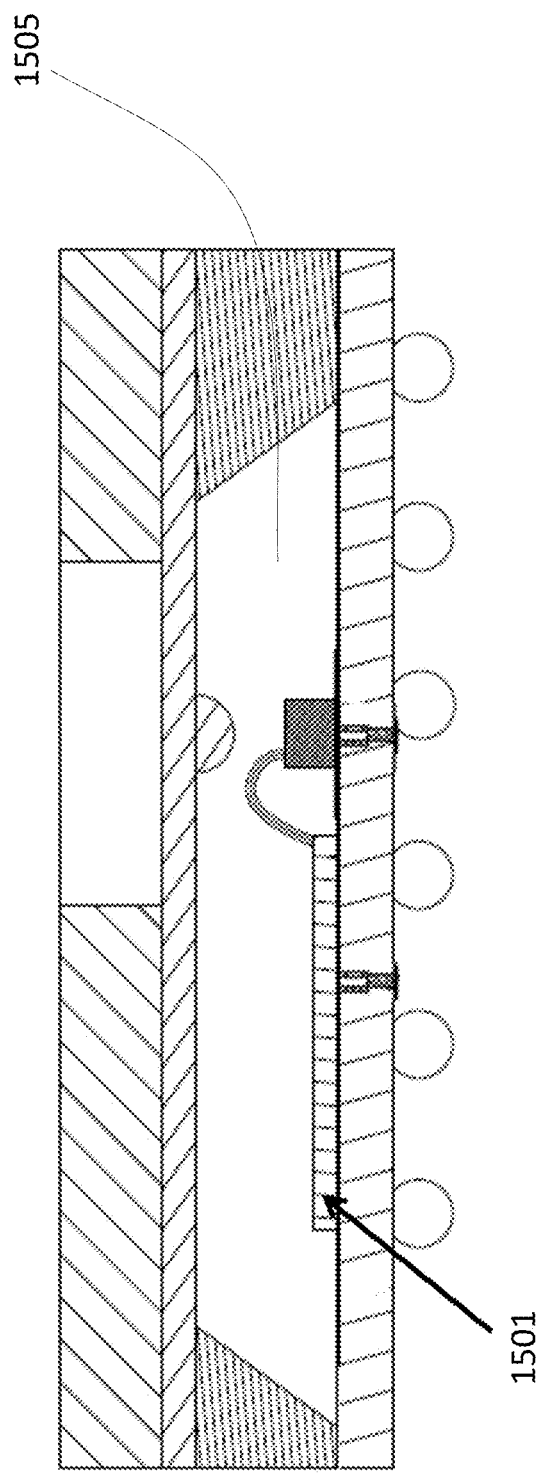
FIG. 15 is a cross-sectional view of an optical subassembly according to another embodiment of the present patent application.
Figure 16:
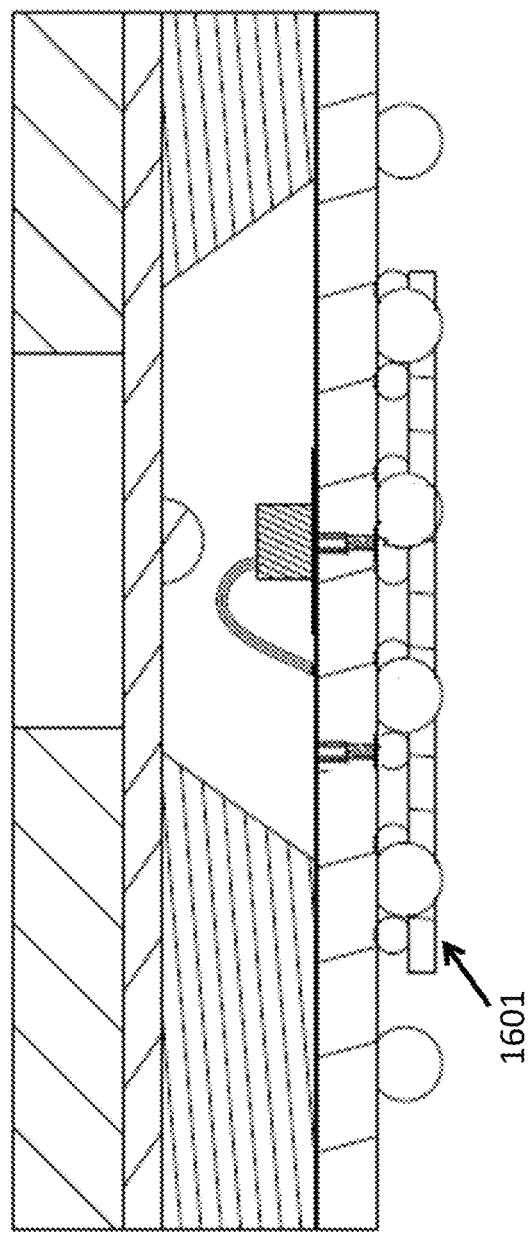
FIG. 16 is a cross-sectional view of an optical subassembly according to another embodiment of the present patent application.

FIG. 15 is a cross-sectional view of an optical subassembly according to another embodiment of the present patent application. Referring to FIG. 15, in this embodiment, an IC driver 1501 is accommodated in the cavity 1505. FIG. 16 is a cross-sectional view of an optical subassembly according to another embodiment of the present patent application. Referring to FIG. 16, in this embodiment, an IC driver 1601 is integrated at the bottom of the optical subassembly by a flip chip.

Figure 17:
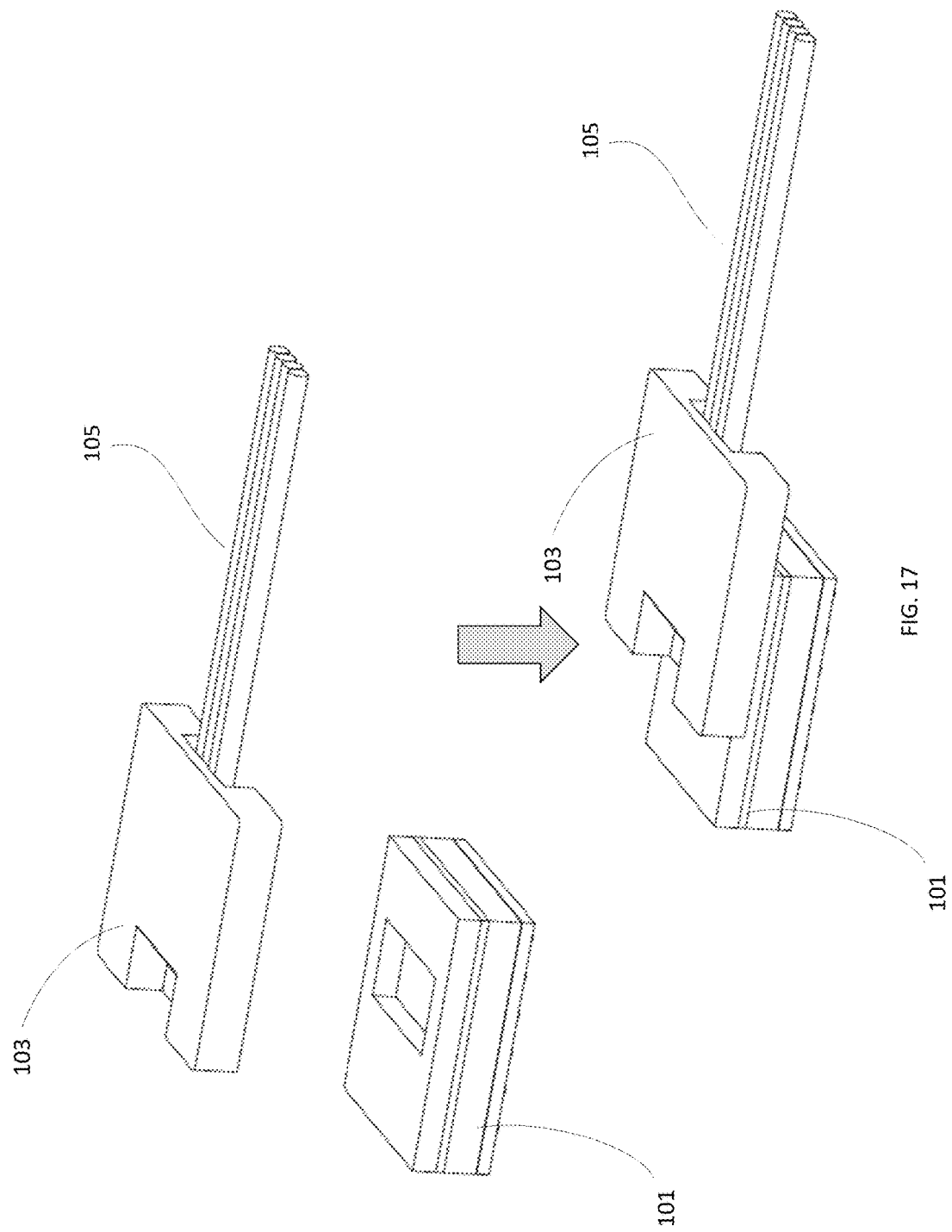
FIG. 17 illustrates the assembly of the optical transceiver module depicted in FIG. 1.

FIG. 17 illustrates the assembly of the optical transceiver module depicted in FIG. 1. Referring to FIG. 17, the jumper 103 is mounted to and engaged with the optical subassembly 101 with the alignment feature 901 (as shown in FIG. 9). The alignment of the triple lens system is very accurate.

Figure 18:
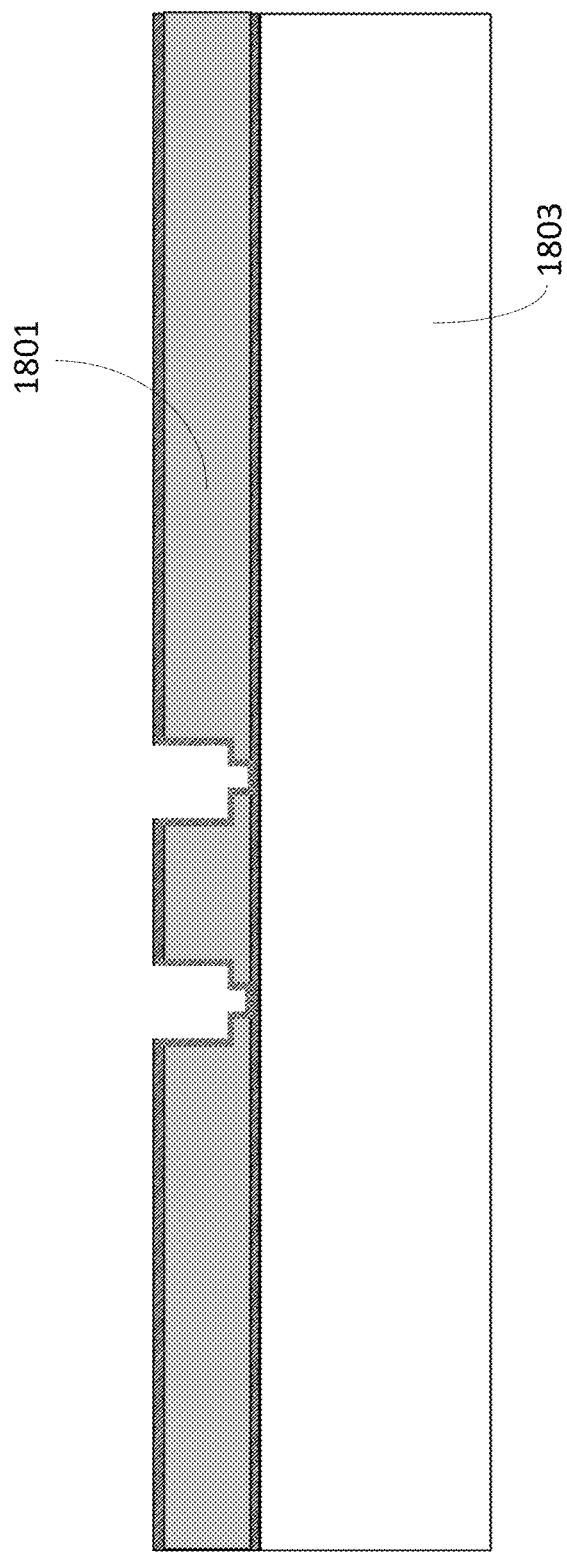
FIG. 18 is a cross-sectional view of a wafer illustrating a step in manufacturing an optical subassembly in accordance with an embodiment of the present patent application.

FIG. 18 is a cross-sectional view of a wafer illustrating a step in manufacturing an optical subassembly in accordance with an embodiment of the present patent application. Referring to FIG. 18, a silicon wafer is grinded to make the thickness of the silicon wafer to be what is required for the TSV submount layer 1801 and bonded through a layer of silicon oxide to a normal silicon wafer acting as a temporary holder 1803. A first photolithography process is carried out to etch small holes by DRIE. A second photolithography process is carried out to etch big holes by DRIE. Passivation is then carried out.

Figure 19:
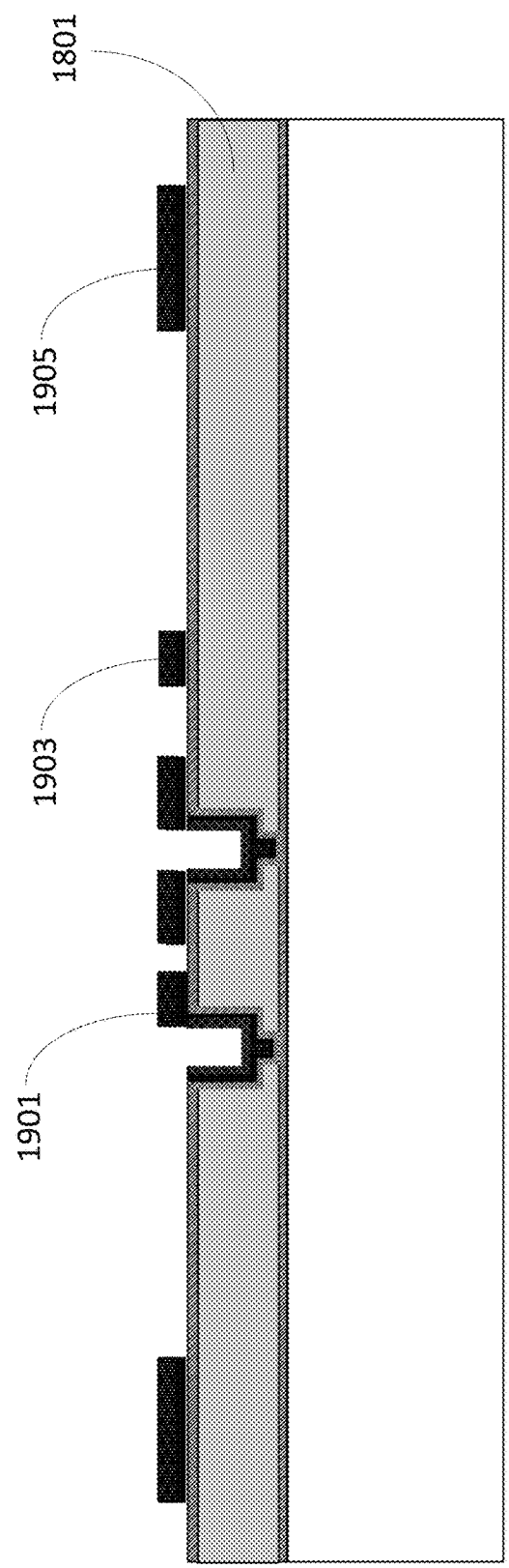
FIG. 19 is a cross-sectional view of the wafer depicted in FIG. 18 illustrating another step in manufacturing the optical subassembly.

FIG. 19 is a cross-sectional view of the wafer depicted in FIG. 18 illustrating another step in manufacturing the optical subassembly. Referring to FIG. 19, a double seed layer deposition for adhesion and plating conductive path. The first layer may be Ti, TiW, Cr and etc., while the second layer may be Au, Cu, and etc. A photolithography process is carried out to define the plating area. An electroplating process is carried out for forming conductive paths in TSVs, electrical pads 1901, fiducial marks 1903 and sealing rings 1905. Small holes of TSVs are fully filled by electroplating Au, Cu, eutectic solder, and etc. Then seed layer removal is carried out.

Figure 20:
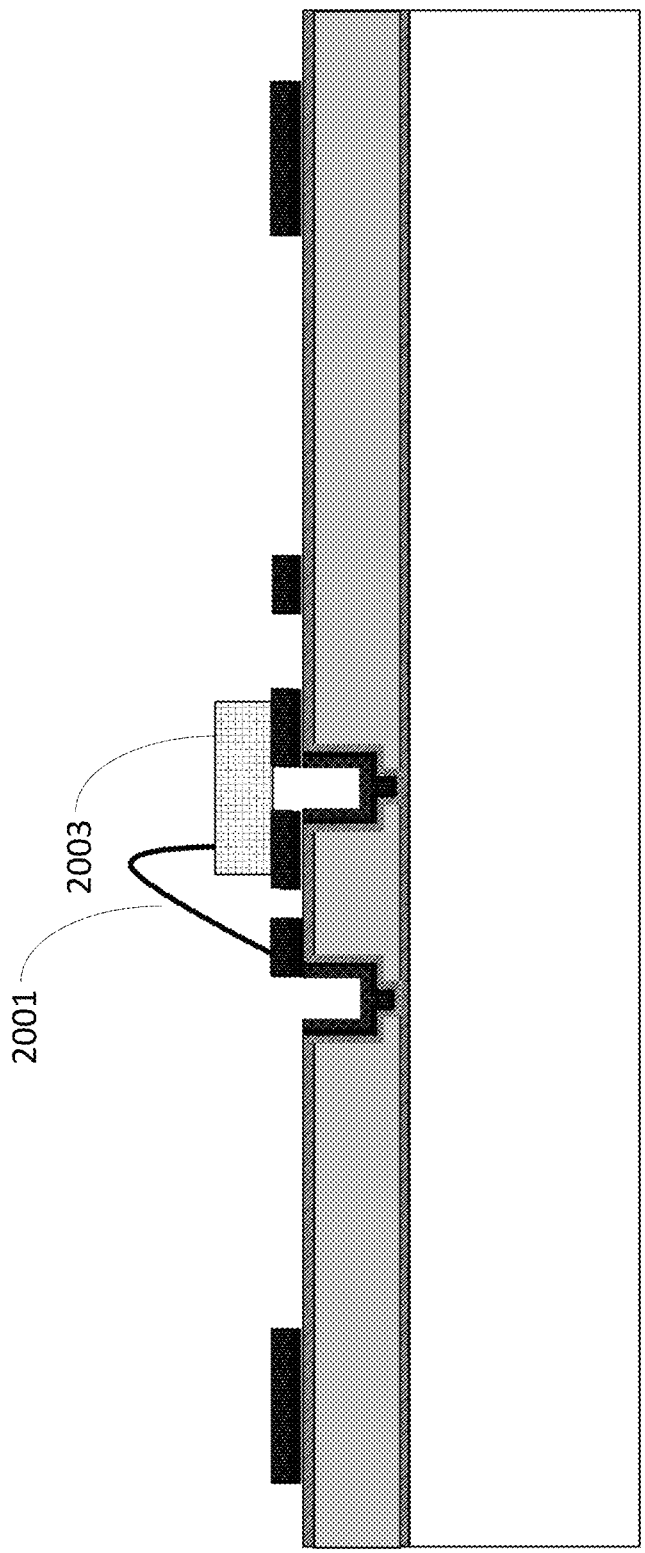
FIG. 20 is a cross-sectional view of the wafer depicted in FIG. 18 illustrating another step in manufacturing the optical subassembly.

FIG. 20 is a cross-sectional view of the wafer depicted in FIG. 18 illustrating another step in manufacturing the optical subassembly. Referring to FIG. 20, wafer level die bonding and wire bonding (referring to bond wire 2001) for the active optical components 2003 are carried out. The TSV submount layer is ready for bonding to form a hermetic package now.

Figure 21:
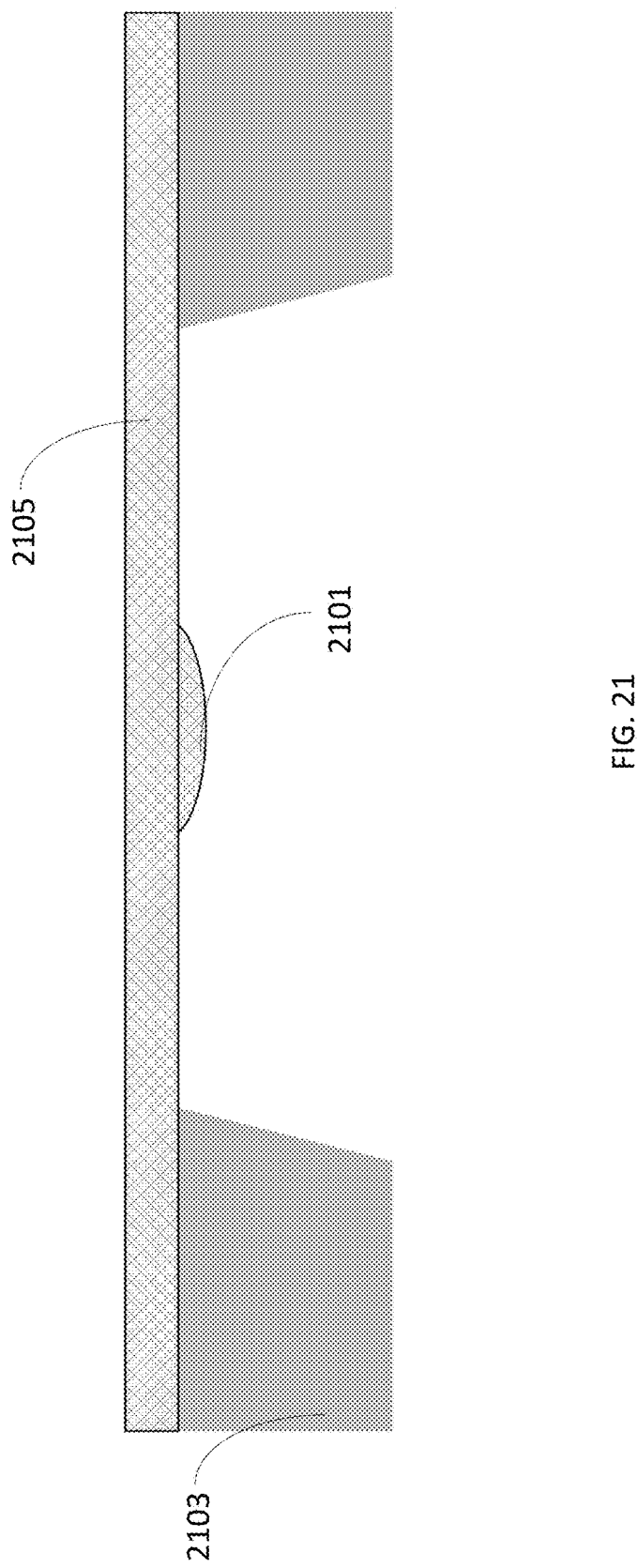
FIG. 21 is a cross-sectional view of a lens and a bottom spacer layer illustrating another step in manufacturing the optical subassembly.

FIG. 21 is a cross-sectional view of a lens and a bottom spacer layer illustrating another step in manufacturing the optical subassembly. Referring to FIG. 21, lens and bottom spacer cavity formation is started from an anodic bonded glass silicon stack. The first lens 2101 is formed on the wafer level according to the designed dimension with an accurate position definition and then the cavity is etched by a normal anisotropic silicon etching process. The bottom spacer layer 2103 and the glass layer 2105 are shown in FIG. 21.

Figure 22:
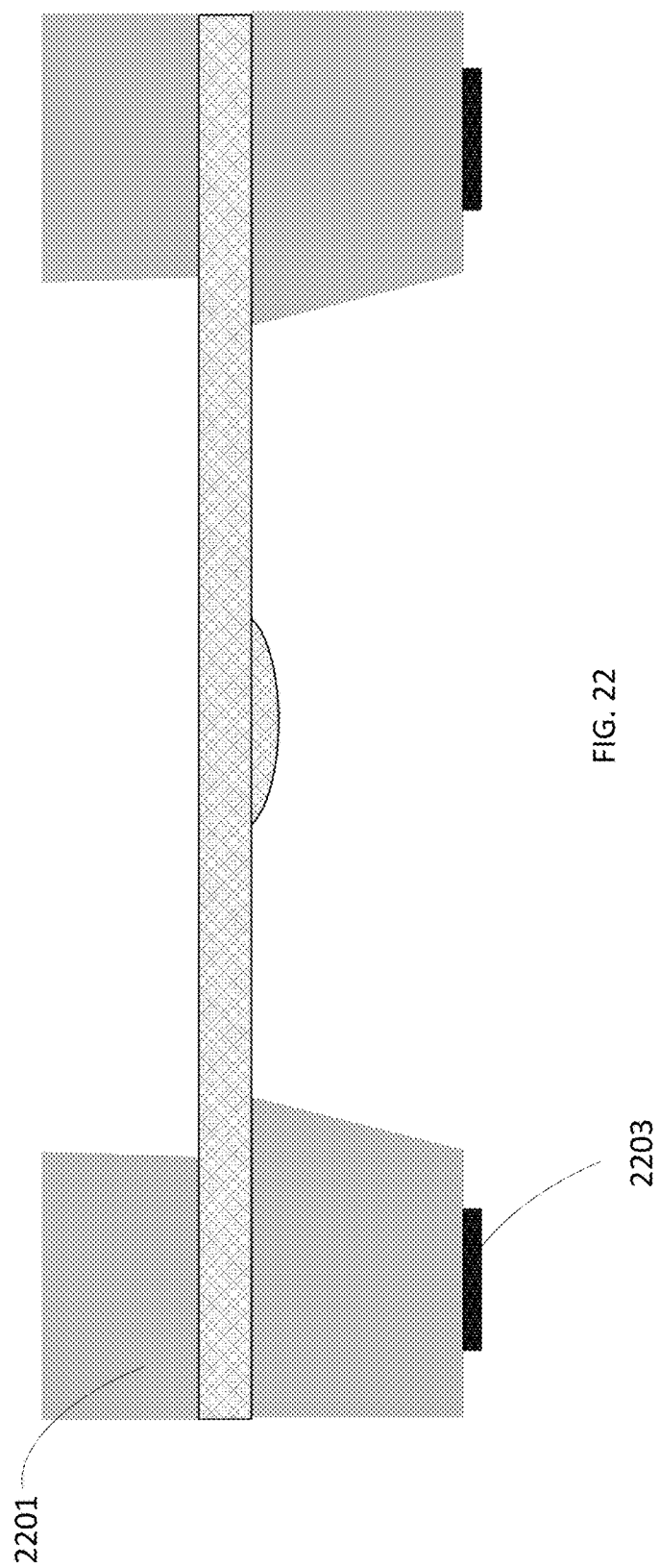
FIG. 22 is an intermediate cross-sectional view of the optical subassembly illustrating another step in manufacturing the optical subassembly.

FIG. 22 is an intermediate cross-sectional view of the optical subassembly illustrating another step in manufacturing the optical subassembly. Referring to FIG. 22, a sandwich cap is formed by further silicon anodic bonding. The bonding accuracy is ensured by designed alignment marks. Other bonding methods may also be used. Metallization is done on the bottom surface for further bonding to TSV submount, and also building the electrical connection 2203 to the ground and bonding pair so as to make the bottom spacer as a magnetic shield. The metal may be Au, Cu, or eutectic solder. The upper spacer layer 2201 is shown in FIG. 22.

Figure 23:
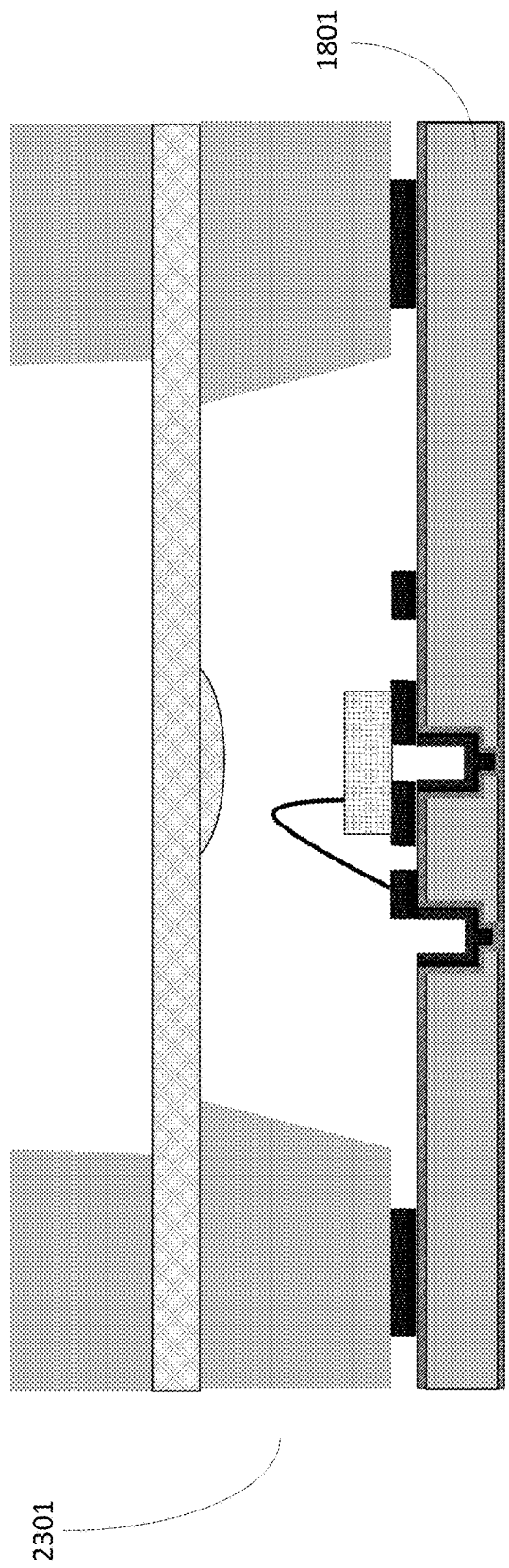
FIG. 23 is another intermediate cross-sectional view of the optical subassembly illustrating another step in manufacturing the optical subassembly.

FIG. 23 is another intermediate cross-sectional view of the optical subassembly illustrating another step in manufacturing the optical subassembly. Referring to FIG. 23, the sandwich cap 2301 is bonded to the TSV submount layer 1801 through eutectic bonding, thermal compression, or epoxy bonding. Further grinding is carried to thin down the TSV submount.

Figure 24:
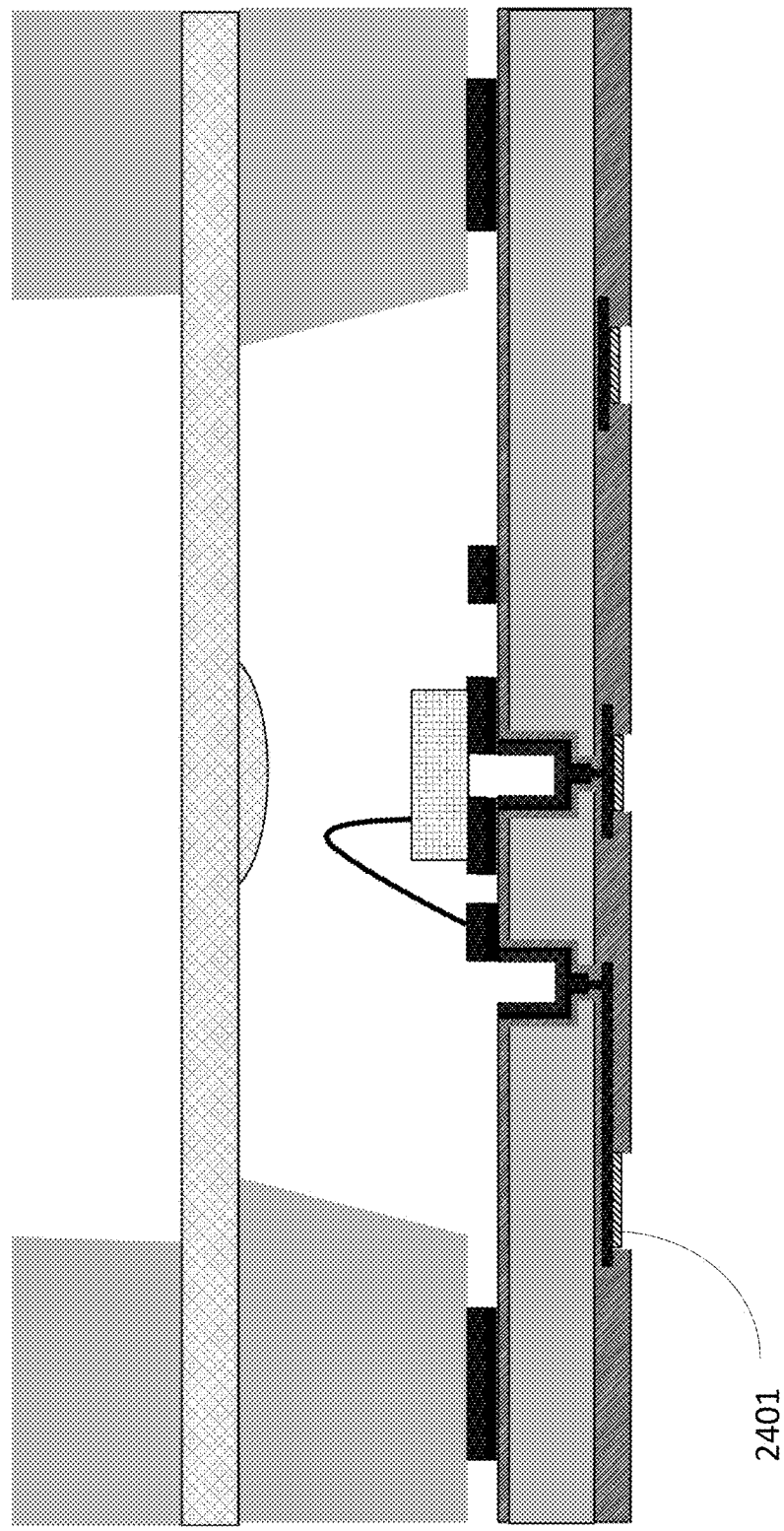
FIG. 24 is another intermediate cross-sectional view of the optical subassembly illustrating another step in manufacturing the optical subassembly.

FIG. 24 is another intermediate cross-sectional view of the optical subassembly illustrating another step in manufacturing the optical subassembly. Referring to FIG. 24, backside metallization and passivation are carried out for electrical routing. The metal may be Al, double metal (Ti, TiW, Cr)/(Cu, Au), and etc. Exposed metal trace will then be deposited by Sn/Au on surface for future solder bumping. Submount backside metal pads and routing traces 2401 are shown in FIG. 24.

Figure 25:
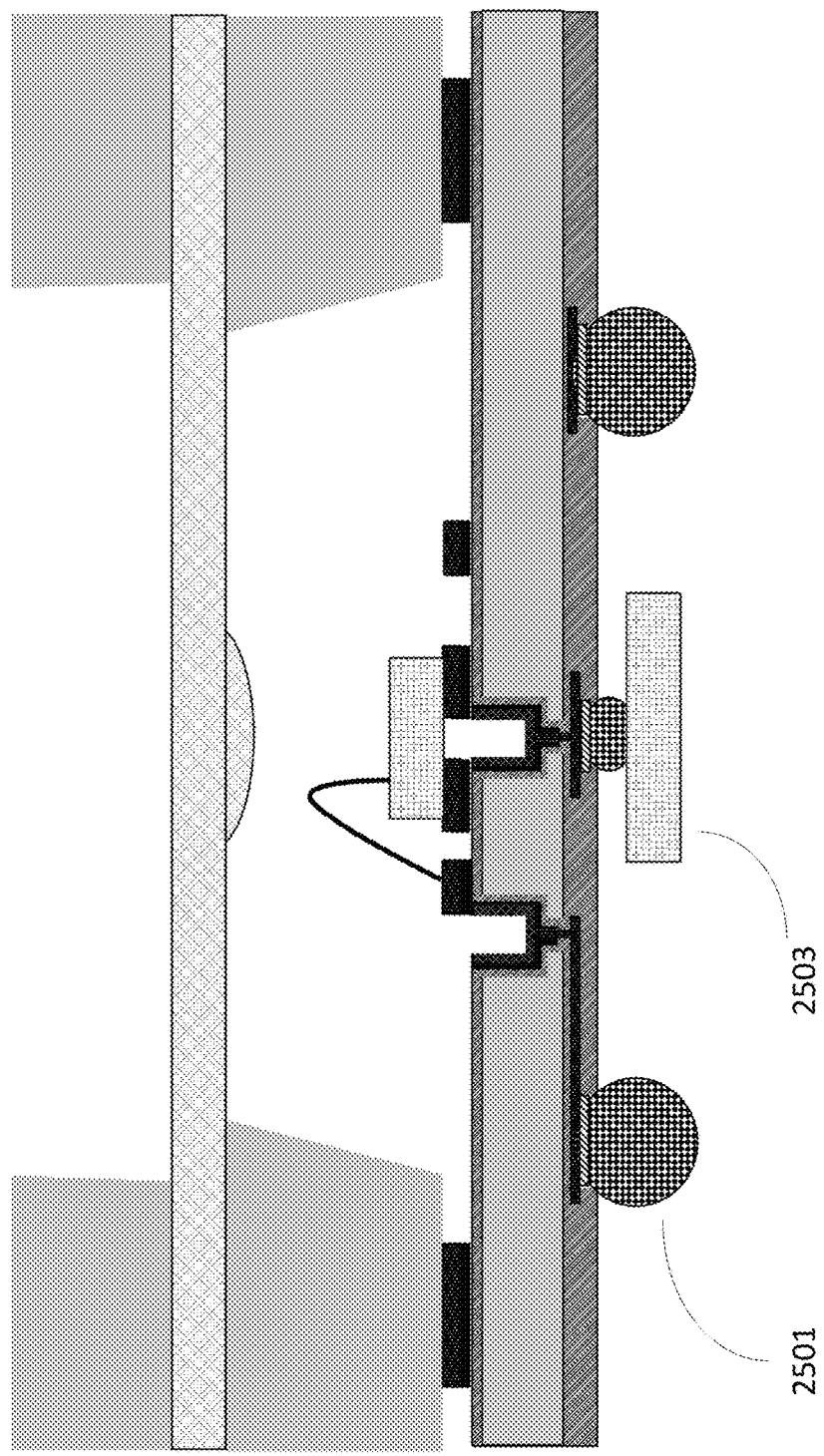
FIG. 25 is another intermediate cross-sectional view of the optical subassembly illustrating another step in manufacturing the optical subassembly.

FIG. 25 is another intermediate cross-sectional view of the optical subassembly illustrating another step in manufacturing the optical subassembly. Referring to FIG. 25, a flip chip process for IC driver is carried out if necessary, followed by a wafer level solder bumping process. Solder balls 2501 and the IC driver 2503 are shown in FIG. 25.

Figure 26:
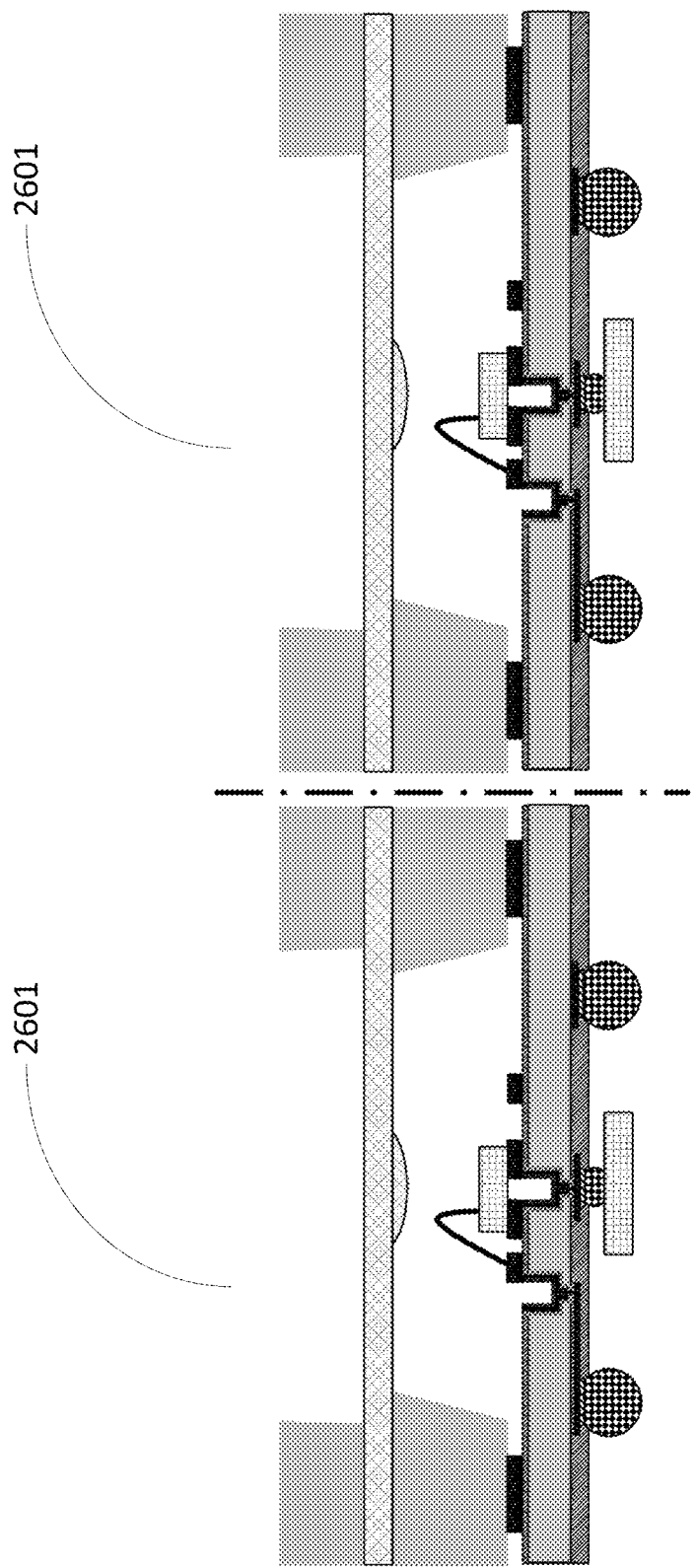
FIG. 26 is another intermediate cross-sectional view of the optical subassembly illustrating another step in manufacturing the optical subassembly.

FIG. 26 is another intermediate cross-sectional view of the optical subassembly illustrating another step in manufacturing the optical subassembly. Referring to FIG. 26, dicing is carried out so that chips 2601 of optical subassembly are singulated for further jumper assembly.

It is noted in the above process, the sandwich cap is formed by wafer level anodic bonding and bonded to the TSV submount layer by thermo compression. It is further noted that although three lenses are described in the above embodiments, in other embodiments the jumper may include a number of lenses and form a multiple lens system along with one ore multiple lenses in the optical subassembly, on an optical path to gather light, correct aberration, focus light, enhance the optical performance and reduce optical energy loss. A first lens formed at a side of the glass layer and facing the cavity may be a lens array to provide more channels for data communication.

In the above-mentioned embodiments, the wafer level packaged optical subassembly and the transceiver module having the same have the advantages of low cost, small size, scalability to high volume manufacturing (HVM), and ease of system integration. The wafer level packaging process can realize high throughput batch fabrication, and hence lower the manufacturing cost. The package scheme illustrated by these embodiments optimizes the optical signal by accurate alignment between the lenses and the active optical components and by the multiple lens system, and improves the active optical components' life time by providing a hermetic environment. Besides providing hermetic package room for the active optical components, the structure also provides precision alignment for the jumper.

While the present patent application has been shown and described with particular references to a number of embodiments thereof, it should be noted that various other changes or modifications may be made without departing from the scope of the present invention.

What is claimed is:

1. An optical subassembly comprising:
   a TSV submount layer carrying an active optical component; and
   a sandwich cap bonded to the TSV submount layer; wherein:
   the sandwich cap comprises a bottom spacer layer disposed above the TSV submount layer, a glass layer above the bottom spacer layer and covering the whole layer of the bottom spacer layer, and an upper spacer layer above the glass layer and covering the whole layer of the glass layer;
   a cavity is defined in the bottom spacer layer and configured for accommodating the active optical component;
   at least one first lens is formed on the glass layer and is opposite to the active optical component; and
   an alignment feature configured to receive and precisely align external opto-mechanical parts is formed in the upper spacer layer; wherein the alignment feature is a through opening and is opposite to the cavity of the bottom spacer layer.

2. The optical subassembly of claim 1, wherein the upper spacer layer is made of silicon, and the through opening is a through silicon opening.

3. The optical subassembly of claim 1, wherein the at least one first lens is formed on one side of the glass layer that is facing the cavity of the bottom spacer layer.

4. The optical subassembly of claim 1 further comprising a plurality of solder balls formed on a side of the TSV submount layer in a wafer level process.

5. The optical subassembly of claim 1 further comprising a first metal layer disposed above the TSV submount layer and a second metal layer disposed below the TSV submount layer, wherein the first metal layer and the second metal layer respectively comprise metal pads and routing traces, and are made of Al, Cu, or Au, while the first metal layer comprises an alignment mark configured for precisely placing the active optical component.

6. The optical subassembly of claim 1, wherein the first lens is formed on the glass layer by wafer lever processing, and configured for collecting maximum light and making the light collimated.

7. The optical subassembly of claim 1 further comprising a metal sealing ring disposed on the TSV submount layer and configured for hermetic sealing and connecting the bottom spacer layer to a ground, and a metalized fiducial mark for optical alignment.

8. The optical subassembly of claim 7, wherein the metal sealing ring and the metalized fiducial mark are formed in a same metal deposition process, while the metal sealing ring is made of Au or eutectic solder, and has a thickness less than 10 µm.

9. The optical subassembly of claim 1, wherein the TSV submount layer is made of silicon and has a thickness ranging from 50 µm to 300 µm, the glass layer has a thickness ranging from 50 µm to 300 µm, the upper spacer layer is made of silicon and has a thickness of about 500 µm, while the bottom spacer layer is made of silicon and has a thickness less than 1000 µm.

10. The optical subassembly of claim 1, wherein side walls of the cavity are slant or straight.

11. The optical subassembly of claim 1 further comprising an IC driver, wherein the IC driver is accommodated in the cavity.

12. The optical subassembly of claim 1 further comprising an IC driver, wherein the IC driver is integrated at the bottom of the optical subassembly by a flip chip.

13. An optical transceiver module comprising:
an optical subassembly, the optical subassembly comprising a TSV submount layer carrying an active optical component and a sandwich cap with an optical window and an alignment feature bonded to the TSV submount layer;
a jumper detachably mounted to the optical subassembly with the alignment feature; and
an optical fiber detachably mounted to the jumper; wherein:
the sandwich cap comprises a bottom spacer layer disposed above the TSV submount layer, a glass layer above the bottom spacer layer and covering the whole layer of the bottom spacer layer, and an upper spacer layer above the glass layer and covering the whole layer of the glass layer;
the alignment feature is formed in the upper spacer layer and is configured to receive and precisely align the jumper; the alignment feature is a through opening and is opposite to the cavity of the bottom spacer layer;
a cavity is defined in the bottom spacer layer and configured for accommodating the active optical component;
at least one first lens is formed at a side of the glass layer that is facing the cavity; and
at least one second lens is formed on a bottom surface of the jumper towards the first lens.

14. The optical transceiver module of claim 13, wherein the upper spacer layer is made of silicon, and the through opening is a through silicon opening.

15. The optical transceiver module of claim 13 further comprising at least one third lens formed on a 45 degree surface of the jumper, and being configured for changing light path and further focusing the light coming from the optical subassembly.

16. The optical transceiver module of claim 13, wherein the sandwich cap is formed by wafer level anodic bonding and bonded to the TSV submount layer by thermo compression.

17. A method for fabricating an optical subassembly, the method comprising:
preparing a TSV submount layer;
die bonding and wire bonding for mounting an active optical component to the TSV submount layer;
forming a sandwich cap with an optical window and an alignment feature; and
bonding the sandwich cap to the TSV submount layer; wherein:
the sandwich cap comprises a bottom spacer layer disposed above the TSV submount layer, a glass layer above the bottom spacer layer and covering the whole layer of the bottom spacer layer, and an upper spacer layer above the glass layer and covering the whole layer of the glass layer;
the alignment feature is formed in the upper spacer layer and is configured to receive and precisely align external opto-mechanical parts; the alignment feature is a through opening and is opposite to the cavity of the bottom spacer layer;
a cavity is defined in the bottom spacer layer and configured for accommodating the active optical component; and
a first lens or lens array is formed at a side of the glass layer that is facing the cavity.

18. The method of claim 17, wherein the alignment feature is configured for detachably mounting a jumper that connects to an optical fiber.

19. The method of claim 17, wherein the TSV submount layer is made of silicon and has a thickness ranging from 50 µm to 300 µm, the glass layer has a thickness ranging from 50 µm to 300 µm, the upper spacer layer is made of silicon and has a thickness of about 500 µm, while the bottom spacer layer is made of silicon and has a thickness less than 1000 µm.

20. The method of claim 17 further comprising forming a plurality of solder balls on a side of the TSV submount layer in a wafer level process.

* * * * *